United States Patent [19]
Parkin

[11] Patent Number: 5,801,984
[45] Date of Patent: Sep. 1, 1998

[54] MAGNETIC TUNNEL JUNCTION DEVICE WITH FERROMAGNETIC MULTILAYER HAVING FIXED MAGNETIC MOMENT

[75] Inventor: Stuart Stephen Papworth Parkin, San Jose, Calif.

[73] Assignee: International Business Machines Corporation, Armonk, N.Y.

[21] Appl. No.: 757,175

[22] Filed: Nov. 27, 1996

[51] Int. Cl.$^6$ .......... G11C 11/00; G11C 11/14; G11C 11/15
[52] U.S. Cl. .......... 365/158; 365/171; 365/173
[58] Field of Search .......... 365/171, 173, 365/7, 8, 158

[56] References Cited

U.S. PATENT DOCUMENTS

| | | | |
|---|---|---|---|
| 3,623,038 | 11/1971 | Franklin et al. | 340/174 TF |
| 5,055,158 | 10/1991 | Gallagher et al. | 156/643 |
| 5,432,734 | 7/1995 | Kawano et al. | 365/158 |
| 5,640,343 | 6/1997 | Gallagher et al. | 365/171 |
| 5,650,958 | 7/1997 | Gallagher et al. | 365/171 |

FOREIGN PATENT DOCUMENTS

WO 95/10123 4/1995 WIPO .......... H01L 43/08

OTHER PUBLICATIONS

J.M. Daughton, "Magnetoresistive Memory Technology", *Thin Solid Films*, vol. 216, 1992, pp. 162–168.

G. R. Harp et al., "Seeded Epitaxy of Metals by Sputter Deposition", *Applied Physics Letters*, vol. 65, No. 24, Dec. 12, 1994, pp. 3063–3065.

M. Julliere, "Tunneling Between Ferromagnetic Films", *Physics Letters*, vol. 54A, No. 3, Sep. 8, 1975, pp. 225–226.

K. P. Kämper et al., "$CrO_2$— A New Half-metallic ferromagnet?", *Physical Review Letters*, vol. 59, No. 24, Dec. 14, 1987, pp. 2788–2791.

M. B. Ketchen et al., "Sub–μm Linewidth Input Coils for Low $T_c$ Integrated Thin–film DC Superconducting Quantum Interference Devices", *Applied Physics Letters*, vol. 61, No. 3, Jul. 20, 1992, pp. 336–338.

K. Matsuyama et al., "Fabrication of Microstructured Magnetic Tunneling Valve Junction ", *IEEE Transactions on Magnetics*, vol. 31, No. 6, Nov. 1995, pp. 3176–3178.

R. Meservey et al., "Spin–polarized Electron Tunneling", *Physics Reports*, vol. 238, No. 4, 1994, pp. 214–217.

T. Miyazaki et al., "Large Magnetoresistance Effect in $82Ni-Fe/Al-Al_2O_3/Co$ Magnetic Tunneling Junction", *Journal of Magnetism and Magnetic Materials*, vol. 98, 1991, pp. L7–L9.

(List continued on next page.)

*Primary Examiner*—David C. Nelms
*Assistant Examiner*—Trong Phan
*Attorney, Agent, or Firm*—Thomas R. Berthold

[57] ABSTRACT

A magnetic tunnel junction device usable as a memory cell or an external magnetic field sensor uses a multilayer of ferromagnetic layers in place of a single hard high-coercivity ferromagnetic layer in one of the two magnetic tunnel junction electrodes. The magnetic tunnel junction element in the device is made up of a ferromagnetic multilayer structure that has high coercivity to maintain its magnetic moment fixed in the presence of an applied magnetic field in the range of interest, a single free ferromagnetic layer whose magnetic moment is free to rotate, and an insulating tunnel barrier layer located between and in contact with the ferromagnetic multilayer structure and the free ferromagnetic layer. The fixed ferromagnetic multilayer structure is made up of two layers, a first ferromagnetic layer with a coercivity substantially higher than the applied field and a thin ferromagnetic interface layer that exhibits high spin filtering and is located between and in contact with the first ferromagnetic layer and the insulating tunnel barrier layer. The material in the first ferromagnetic layer of the multilayer can have low magnetization and thus poor spin filtering because the spin filtering is provided by the interface layer. The interface ferromagnetic layer in the multilayer has relatively low coercivity but is kept thin so that the overall coercivity of the multilayer is not degraded.

30 Claims, 11 Drawing Sheets

OTHER PUBLICATIONS

T. Miyazaki et al., "Giant Magnetic Tunneling Effect in Fe/Al$_2$O$_3$/Fe Junction", *Journal of Magnetism and Magnetic Materials*, vol. 139, 1995, pp. L231–L234.

J. S. Moodera et al., "Variation of the Electron–spin Polarization in EuSe Tunnel Junctions From Zero to Near 100% in a Magnetic Field", *Physical Review Letters*, vol. 70, No. 6, Feb. 8, 1993, pp. 853–856.

J. S. Moodera et al., "Large Magnetoresistance at Room Temperature in Ferromagnetic Thin Film Tunnel Junctions", *Physical Review Letters*, vol. 74, No. 16, Apr. 17, 1995, pp. 3273–3276.

J. S. Moodera et al., "Ferromagnetic–insulator–ferromagnetic Tunneling: Spin-dependent Tunneling and Large Magnetoresistance in Trilayer Junctions", *Journal of Applied Physics*, vol. 79, No. 8, Apr. 15, 1996, pp. 4724–4729.

J. S. Moodera et al., "Geometrically Enhanced Magnetoresistance in Ferromagnet–Insulator–Ferromagnet Tunnel Junctions", *Applied Physics Letters*, vol. 69, No. 5, Jul. 29, 1996, pp. 708–710.

S. S. P. Parkin, "Origin of Enhanced Magnetoresistance of Magnetic Multilayers: Spin-dependent Scattering From Magnetic Interface States", *Physical Review Letters*, vol. 71, No. 10, Sep. 6, 1993, pp. 1641–1644.

J. C. Slonczewski, "Magnetic Bubble Tunnel Detector", *IBM Technical Disclosure Bulletin*, vol. 19, No. 6, Nov. 1976, pp. 2328–2330.

J. C. Slonczewski, "Magnetic–field Tunnel–sensor", *IBM Technical Disclosure Bulletin*, vol. 19, No. 6, Nov. 1976, pp. 2331–2332.

J. C. Slonczewski, "Magnetic–barrier Current Amplifier", *IBM Technical Disclosure Bulletin*, vol. 19, No. 6, Nov. 1976, pp. 2333–2336.

C. Tsang et al., "Design, Fabrication & Testing of Spin–valve Read Heads for High Density Recording", *IEEE Transactions on Magnetics*, vol. 30, No. 6, Nov. 1994, pp. 3801–3806.

R. Wiesendanger et al., "Observation of Vacuum Tunneling of Spin–polarized Electrons with the Scanning Tunneling Microscope", *Physical Review Letters*, vol. 65, No. 2, Jul. 9, 1990, pp. 247–250.

T. Yaoi et al., "Dependence of Magnetoresistance on Temperature and Applied Voltage in a 82Ni–Fe/Al–Al$_2$O$_3$/Co Tunneling Junction", *Journal of Magnetism and Magnetic Materials*, vol. 126, 1993, pp. 430–432.

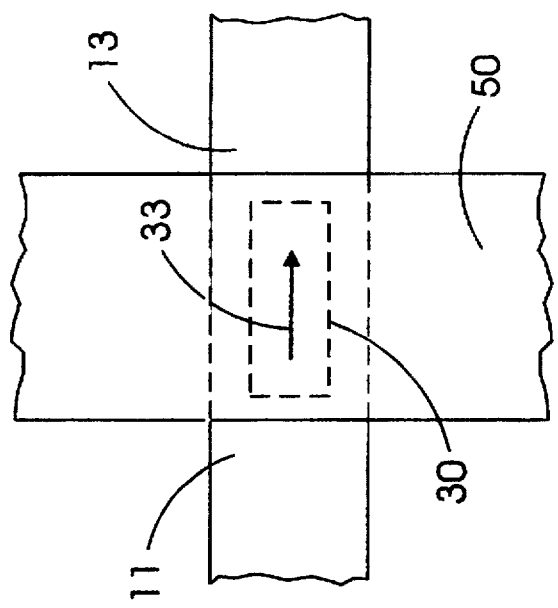
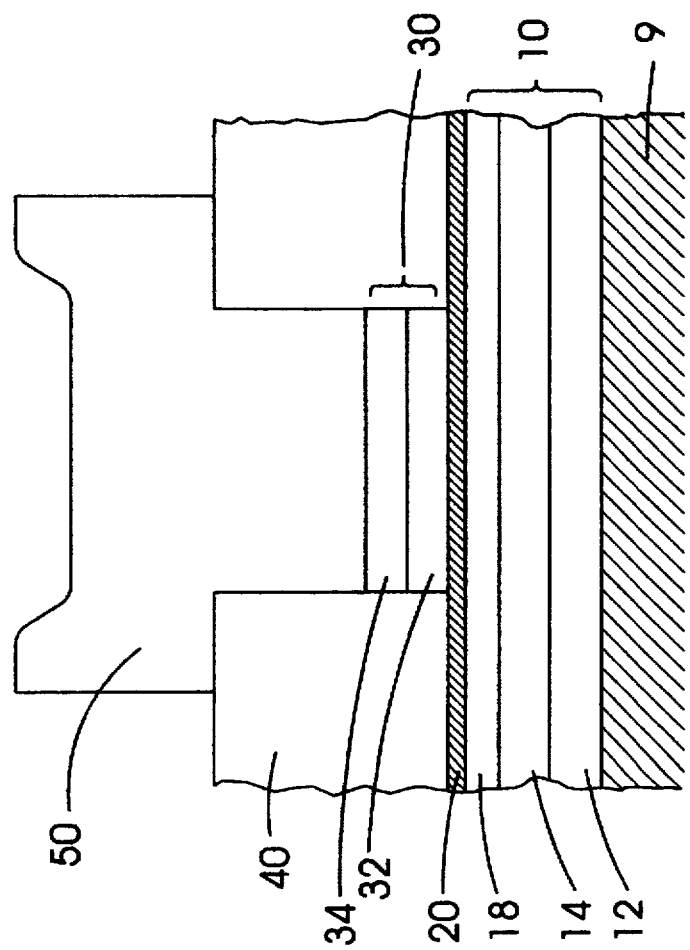
FIG. 1A (PRIOR ART)
FIG. 1B (PRIOR ART)

$Co_{75}Pt_{12}Cr_{13}/Co/Al_2O_3/Co$ MTJ - easy axis along 0°

$Co_{75}Pt_{12}Cr_{13}/Co/Al_2O_3/Co$ MTJ
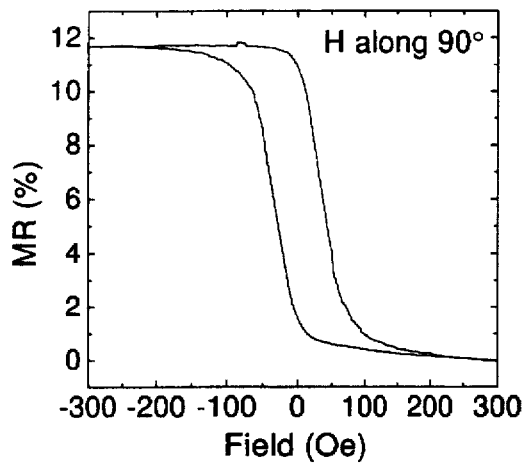
Fig. 9A
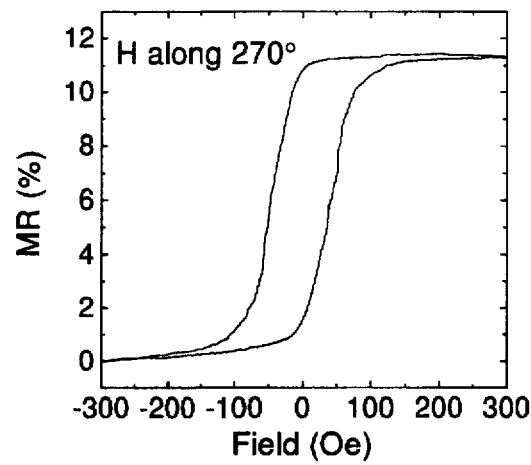
Fig. 9B
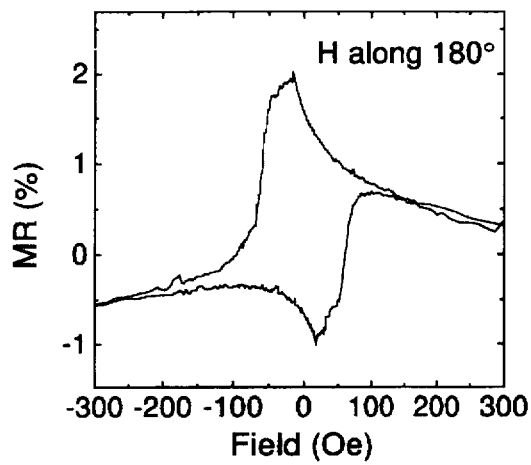
Fig. 9C
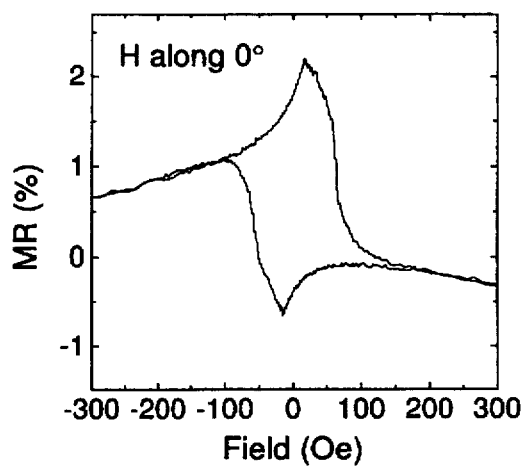
Fig. 9D
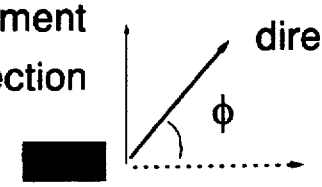
$\phi=90$: fixed moment direction
direction of sense field
$\phi=0$: easy axis of Cobalt free layer

MAGNETIC TUNNEL JUNCTION DEVICE WITH FERROMAGNETIC MULTILAYER HAVING FIXED MAGNETIC MOMENT

This invention was made with Government support under Contract MDA 972-96-C0014 awarded by the Advanced Research Projects Agency. The Government has certain rights in this invention.

TECHNICAL FIELD

This invention relates to magnetic tunnel junction (MTJ) devices for memory and external magnetic field-sensing applications. More particularly the invention relates to a MTJ device that uses a multilayer of ferromagnetic layers as the fixed ferromagnetic layer whose magnetic moment does not rotate in the presence of applied magnetic fields in the range of interest.

BACKGROUND OF THE INVENTION

A magnetic tunnel junction (MTJ) is a device comprised of two ferromagnetic electrodes separated by a thin insulating layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic electrodes. The two ferromagnetic electrodes are designed to have different responses to magnetic fields so that the relative orientation of their moments can be varied with an external magnetic field.

Experimental results for tunneling between ferromagnetic electrodes prior to about 1993 were reviewed by R. Meservey et al. in "Spin-polarized Electron Tunneling", *Physics Reports*, Vol. 238, pp. 214–217, and showed only very small responses at room temperature, at best being on the order of 1–2%. The only indications of reasonably-sized responses were from two experiments with scanning tunneling microscopes. One of these employed a 100% spin-polarized $CrO_2$ tip and indicated a polarized current modulation of 40% at room temperature, as described by R. Wiesendanger et al. in "Observation of Vacuum Tunneling of Spin-polarized Electrons with the Scanning Tunneling Microscope", *Physics Review Letters*, Vol. 65, 1990, page 247.

A very large MTJ device with an 18% magnetoresistance response was reported by T. Miyazaki et al. in "Giant Magnetic Tunneling Effect in Fe/$Al_2O_3$/Fe Junction", *Journal of Magnetism and Magnetic Materials*, Vol. 139, No. L231, 1995. However, the authors report that they could not reproduce their 18% magnetoresistance result. Other junctions fabricated at the same time had responses of only 1–6%. Others have reported MTJ devices with magnetoresistance of up to 18% at room temperature in large CoFe/$Al_2O_3$/Co junctions as described by J. S. Moodera et al. in "Large Magnetoresistance at Room Temperature in Ferromagnetic Thin Film Tunnel Junctions", *Physics Review Letters*, Vol. 74, 1995, page 3273; and J. S. Moodera and L. R. Kinder in "Ferromagnetic-Insulator-Ferromagnetic Tunneling: Spin Dependent Tunneling and Large Magnetoresistance in Trilayer Junctions", *Journal of Applied Physics*, Vol. 79, 1996, page 4724. The authors hypothesized that a decrease in surface roughness was a key to better results. To achieve this, they went to extreme measures for the base electrode growth, combining evaporation onto cryogenically-cooled substrates, the use of a seed layer, and keeping the base electrode extremely thin. The tunnel barrier was formed by cryogenically depositing an Al layer and then warming this and plasma oxidizing it, consuming most of the Al. In the first of these papers, it was reported that the largest junction magnetoresistance change observed at room temperature was 11.8%. In the second paper, the highest change in a junction magnetoresistance was reported to be 18% at room temperature, and it was reported that many junctions had magnetoresistance changes in the range of 14–17% at room temperature. The junction resistances were in the range of hundreds of Ohms to tens of kOhms for junctions with cross-sectional areas of 200×300 $\mu m^2$.

Thus, it is apparent that it has been difficult to make MTJ devices at room temperature with a large enough magnetoresistance response to be useful. The first observation of a magnetoresistance response of the expected magnitude at room temperature occurred in a spin-polarized scanning tunneling microscope. Subsequently in the prior art, only Moodera and coworkers have been able to reproducibly obtain MTJ responses of the expected magnitude at room temperature, but this was only for large devices made using exotic and impractical thin film deposition techniques.

An additional problem with prior art MTJ devices is that the magnetoresistance response versus magnetic field did not exhibit an ideal step-like response to magnetic field. T. Miyazaki et al. in "Large Magnetoresistance Effect in 82Ni—Fe/Al—Al2O3/Co Magnetic Tunneling Junction", *Journal of Magnetism and Magnetic Materials*, Vol. 98, No. L7, 1991, illustrated how it was possible to obtain a step-like magnetoresistance response, but only over a restricted applied magnetic field range. If the applied magnetic field excursion were momentarily too large, the magnetoresistance response characteristic could become inverted.

Recently, in IBM's application Ser. No. 08/618,300, filed Mar. 18, 1996, which is now U.S. Pat. No. 5,650,958, issued Jul. 22, 1997 it has been demonstrated how to fabricate a MTJ device with a large room-temperature magnetoresistance response and a controlled magnetic response by the use of an antiferromagnetic exchange bias layer to magnetically harden or magnetically pin one of the two ferromagnetic layers in the MTJ device. This MTJ device has an unambiguous and controlled magnetoresistance response to magnetic signals. However, such a device, which incorporates an antiferromagnetic exchange bias layer, can only be operated over a limited range of temperature defined by the blocking temperature of the exchange bias material. In addition, the thermal stability of such a device is limited by the thermal stability of the exchange bias layer in contact with the neighboring layers. An alternative MTJ device well known in the art is a simpler device wherein the MTJ element incorporates two ferromagnetic layers, each with a distinct and different magnetic coercivity. One of these layers, the hard or fixed ferromagnetic layer, is chosen to have a much higher coercivity than the other, which is the sense or soft ferromagnetic layer. However, such prior art MTJ devices either fail to exhibit two well-defined magnetic states at zero field or exhibit low values of magnetoresistance.

What is needed is a MTJ device that is stable at high temperatures and that has a fixed ferromagnetic layer with all the desired properties of high coercivity, high remanent magnetization, and high spin polarization so that the MTJ device exhibits two well-defined states at zero magnetic field as well as high magnetoresistance.

SUMMARY OF THE INVENTION

The invention is a MTJ device usable as a memory cell or an external magnetic field sensor that uses a multilayer of ferromagnetic layers in place of a single hard high-coercivity ferromagnetic layer in one of the two MTJ electrodes. The MTJ element in the device is made up of a ferromagnetic multilayer structure that has high coercivity to maintain its magnetic moment fixed in the presence of an applied magnetic field in the range of interest, a single free ferromagnetic layer whose magnetic moment is free to rotate, and an insulating tunnel barrier layer located between and in contact with the ferromagnetic multilayer structure and the free ferromagnetic layer. The fixed ferromagnetic multilayer structure is made up of two layers, a first ferromagnetic layer with a coercivity substantially higher than the applied field, and a thin ferromagnetic interface layer that exhibits high spin filtering and is located between and in contact with the first ferromagnetic layer and the insulating tunnel barrier layer. The material in the first ferromagnetic layer of the multilayer can have low magnetization and thus poor spin filtering because the spin filtering is provided by the interface layer. The interface ferromagnetic layer in the multilayer has relatively low coercivity, but is kept thin so that the overall coercivity of the multilayer is not degraded. The MTJ device has a high tunneling magnetoresistance response, exhibits two well-defined magnetic states at zero field, and is stable at high operating temperatures.

For a fuller understanding of the nature and advantages of the present invention, reference should be made to the following detailed description taken together with the accompanying figures.

BRIEF DESCRIPTION OF THE DRAWING

FIGS. 1A–1B show a cross-section view and a top view, respectively, of a MTJ memory cell device using a prior art MTJ, but having a structure with a self-aligned contact hole through an insulating layer according to the previously-cited copending application.

FIGS. 6A–6B are tunneling magnetoresistance versus applied field response curves of the MTJ represented in FIG. 5 according to the present invention, wherein FIG. 6A shows the response of the MTJ for sense fields in the range ±5000 Oe, and FIG. 6B shows the response of the same MTJ for sense fields in the range ±300 Oe.

FIGS. 7A–7B are tunneling magnetoresistance versus applied field response curves of a MTJ similar to the MTJ of the present invention, but having a single fixed ferromagnetic layer of $Co_{75}Pt_{12}Cr_{13}$ in place of a fixed multilayer structure, wherein FIG. 7A shows the response of the MTJ for sense fields in the range ±5000 Oe, and FIG. 7B shows the response of the same MTJ for sense fields in the range ±300 Oe.

FIGS. 9A–9D are typical response curves of the MTJ of the present invention for fields in the range ±300 Oe for four different directions in the plane of the MTJ taken after the hard ferromagnetic layer of the MTJ has been set by applying a field of 5000 Oe along the hard direction of the Co free layer.

DESCRIPTION OF THE PREFERRED EMBODIMENTS

Figure 1C:
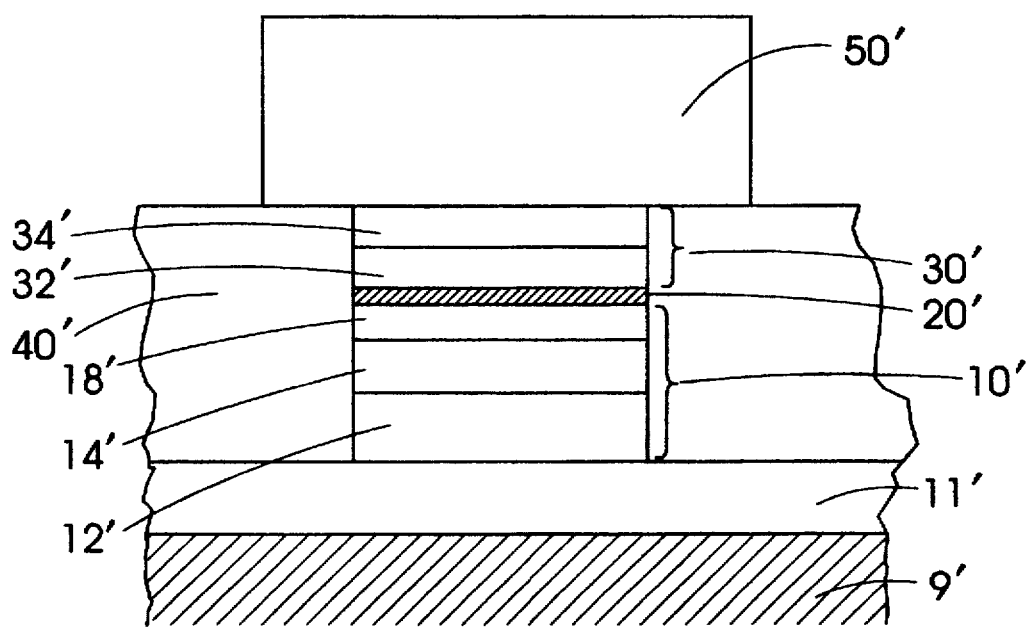
FIG. 1C shows a cross-section view of a MTJ device like that of FIG. 1A, but with a planarized, self-aligned contact hole and all of the layers of the MTJ having the same contiguous side edges according to the previously-cited copending application.

For purposes of understanding the present invention, a conventional prior art MTJ element will be described in FIGS. 1–3 as it would be incorporated into a MTJ device of the type which is described and shown in IBM's application Ser. No. 08/618,300, filed Mar. 18, 1996, which is now U.S. Pat. No. 5,650,959, issued Jul. 22, 1997.

FIGS. 1A–1B illustrate schematically a MTJ device suitable for a magnetic memory cell application. The MTJ device, shown in cross-section in FIG. 1A and from a top view in FIG. 1B, is depicted, for purposes of understanding, with a conventional prior art MTJ element that includes a base electrode stack 10, an insulating tunnel barrier layer 20, and a top electrode stack 30. The MTJ is formed on substrate 9 and the MTJ device is completed by an insulating layer 40 with a contact hole through it, and a top wiring layer 50 that serves as an electrical lead. Each of the electrode stacks 10, 30 has a ferromagnetic layer located on opposite sides of and in contact with the tunnel barrier layer 20. The base electrode stack 10 formed on substrate 9 includes a seed layer 12 and an underlayer 14 deposited on substrate 9 and a "fixed" ferromagnetic layer 18 formed on the underlayer 14. The ferromagnetic layer 18 is called the fixed layer because it is formed of a high-coercivity material whose magnetic moment (magnetization direction) is prevented from rotation in the presence of applied magnetic fields in the desired range of interest for the MTJ device, i.e., the magnetic field caused by the write current applied to the memory cell from the read/write circuitry of the memory array. The top electrode stack 30 includes a "free" ferromagnetic layer 32 and a protective layer 34 formed on the free layer 32. The magnetic moment of the free ferromagnetic layer 32 is not fixed, and is thus free to rotate in the presence of an applied magnetic field in the range of interest. Both of the ferromagnetic layers 18 and 32 in electrode stacks 10 and 30, respectively, are fabricated so as to have their easy axes of magnetization generally parallel to one another in the same direction parallel to the length of the bottom wiring layer, which is formed as the extensions 11, 13 of base electrode 10 (FIG. 1B). This direction is shown by the arrow 33 in FIG. 1B. The fixed ferromagnetic layer 18 in stack 10 just beneath the tunnel barrier layer 20 has its magnetic moment fixed because the layer is formed of high-coercivity material, i.e., substantially higher than the applied magnetic field in the range of interest. For magnetic fields of magnitude comparable to those applied to the memory cell during read and write operations of the cell, there is only one possible orientation for the magnetic moment of the fixed ferromagnetic layer 18. The free ferromagnetic layer 32 in top electrode stack 30 is anisotropic in its magnetization properties, but its magnetization direction is not fixed. Rather, its magnetization direction can be stably oriented along either direction of its easy axis by the application of a magnetic field in the desired range.

FIG. 1C illustrates the cross-section of a conventional prior art MTJ like that of FIG. 1A, except that it is incorporated into the MTJ memory cell described and shown as an embodiment in the previously-cited copending application. The base electrode stack 10', the insulating tunnel barrier 20', and the top electrode stack 30' all have the same cross-sectional area. The base electrode stack 10' is formed on wiring lead 11' that is formed on the substrate 9'. The insulating layer 40' surrounds the entire MTJ and extends down to lead 11'. The insulating layer 40' and the protective layer 34' are essentially coplanar so that the electrical lead 50' is formed as a planarized layer on top of the MTJ element. This structure allows for the memory cell to be readily fabricated on top of electronic devices, such as a diode or transistor, for manipulating sense current through the individual magnetic cells.

When the MTJ memory cell is in an array of memory cells connected to read/write circuitry, writing to the cell is accomplished by passing write currents through the top 50 and bottom 11, 13 electrode wiring layers (FIGS. 1A–1B) (or by passing current through a combination of these and/or other write and/or bit lines located near the MTJ cell). When a sufficiently large current is passed through both of these lines, the combined magnetic field that they generate in the vicinity of the free ferromagnetic layer 32 will cause the magnetization direction of the free ferromagnetic layer 32 to rotate from being parallel to antiparallel (or vice versa) to the magnetization direction of the fixed ferromagnetic layer 18. The current levels are selected so that the combined magnetic field they generate exceeds the switching field of the free ferromagnetic layer. This field generated by the combined write currents is selected to be much smaller that the field required to rotate the magnetization of the fixed ferromagnetic layer. The write currents do not pass perpendicularly through the MTJ, which has a high resistance compared to the resistances of wiring layers 50 and 11, 13. The MTJ memory cell is read by passing a sense current perpendicularly through the MTJ from the fixed ferromagnetic layer through the tunnel junction barrier to the free ferromagnetic layer (or vice versa). The state of the memory cell is determined by measuring the resistance of the memory cell when a sense current, much smaller than the write currents, is passed perpendicularly through the MTJ. The self-field of this sense or read current is negligible and does not affect the magnetic state of the memory cell.

The probability of tunneling of charge carriers across the tunnel barrier depends on the relative alignment of the magnetic moments of the two ferromagnetic layers. The tunneling current is spin polarized, which means that the electrical current passing from one of the ferromagnetic layers is predominantly composed of electrons of one spin type (spin up or spin down, depending on the orientation of the magnetization of the ferromagnetic layer). The degree of spin polarization of the current is determined by the electronic properties of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on the spin polarization of the electrical current and the electronic properties of both of the ferromagnetic layers. As a result, the two possible magnetization directions of the free ferromagnetic layer uniquely define two possible bit states (0 or 1) of the memory cell.

Figure 2B:
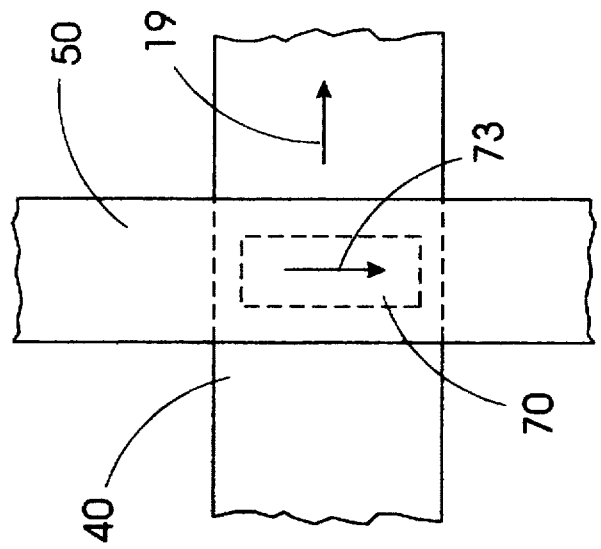
FIGS. 2A–2B show a cross-section view and a top view, respectively, of a MTJ magnetic field-sensing device using a prior art MTJ, but having a structure with a planarized, self-aligned contact hole according to the previously-cited copending application.
Figure 2A:
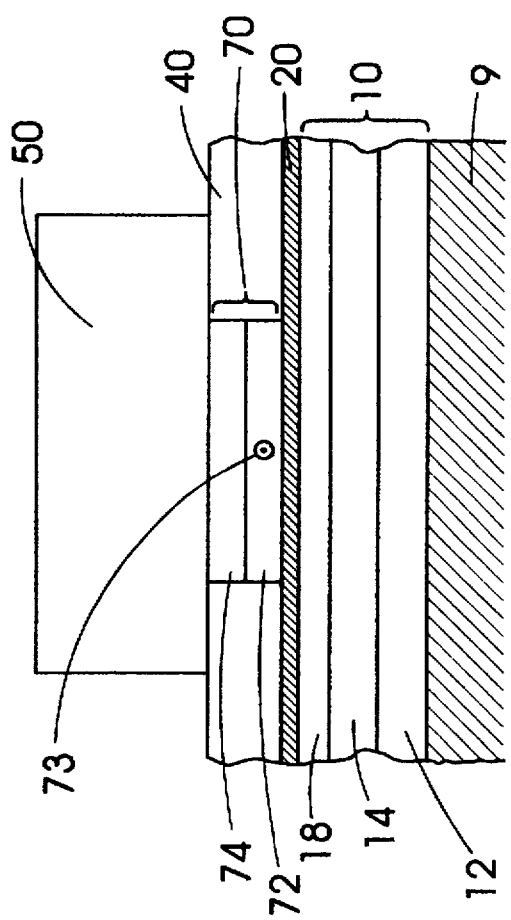

FIGS. 2A–2B illustrate a cross-section and top view, respectively, of a conventional prior art MTJ incorporated into an MTJ device for use as an external field sensor, as described in IBM's previously-cited copending application. The MTJ is like that of FIGS. 1A–1B, except that the top junction electrode stack 70 contains a ferromagnetic layer 72 adjacent to the tunnel barrier layer 20 whose easy axis of magnetization is aligned perpendicular, rather than parallel, to the magnetization of the pinned ferromagnetic layer 18 in the bottom electrode stack 10. This allows the MTJ device to function as a sensor for detecting magnetically-recorded data from a magnetic medium, such as a magnetic recording disk. As described in the previously-cited copending application, the top wiring layer 50 is formed on protective layer 74 and is spaced from the junction by the planarized insulating layer 40. For low applied external fields, the magnetization direction (arrow 19) of the hard ferromagnetic layer 18 in the bottom electrode 10 is fixed, while the magnetization direction (arrow 73) of the free ferromagnetic layer 72 is free to rotate in the plane of the substrate 9 toward or away from the direction of arrow 19.

Both the MTJ memory cell and the MTJ magnetic field sensor as described above contain the common elements of a conventional prior art MTJ element, i.e., a lower electrode 10 with a hard high-coercivity fixed ferromagnetic layer, an upper electrode 30 with a free ferromagnetic layer, and a tunnel barrier 20. These common elements will be referred to as the "MTJ element". The basic thin film structure of the MTJ element for use in memory and field-sensing MTJ devices is the same with regard to the sequence of layers and their composition. A schematic representation of the layers making up this basic prior art MTJ element is shown in FIG. 3. This element has a lower electrode 10 comprised of 5 nm Ta/10 nm $Co_{50}Fe_{50}$ as the seed layer 14 and fixed ferromagnetic layer 18, respectively. Electrode 10 is formed on electrical lead layer 11 on substrate 9. The tunnel barrier 20 is a 1.6 nm thick Al layer plasma oxidized for 600 seconds to form alumina ($Al_2O_3$). The top electrode stack 30 is comprised of a single layer of 20 nm $Ni_{60}Fe_{40}$ as the free ferromagnetic layer 32. The electrical lead 50 is formed as a layer of 20 nm Cu directly on ferromagnetic layer 32 without the use of a protective layer (layer 34 in FIG. 1A).

This MTJ element is prepared by first depositing the lower electrode 10 in a magnetic field applied parallel to the surface of the substrate. Next, the tunnel barrier layer 20 is formed by depositing and then plasma oxidizing a 1.6 nm Al layer to create a layer of nominally $Al_2O_3$. Subsequently, the top electrode stack 30 is formed. The various layers are deposited by DC magnetron sputter deposition using conventional sputtering techniques with the substrate at room temperature. Typical deposition rates are 2 Å/sec for all the layers with the exception of Al, which is deposited at 1 Å/sec. The lower deposition rate for Al gives rise to smoother Al layers. It is important that the layers in the bottom electrode stack 10 be smooth, and that the $Al_2O_3$ layer 20 be free of pinholes which would otherwise electrically short the junction.

Figure 3:
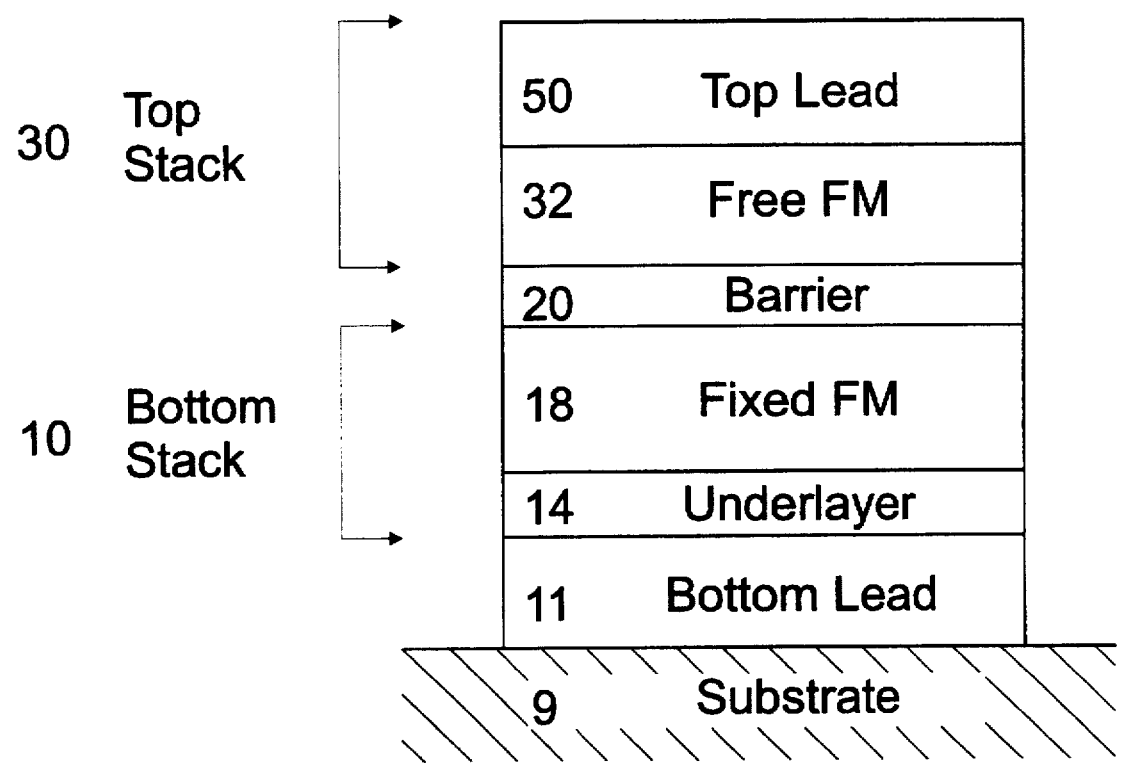
FIG. 3 is a schematic representation of the layers making up a prior art MTJ with magnetically hard and soft ferromagnetic layers as the two electrodes.
Figure 4:
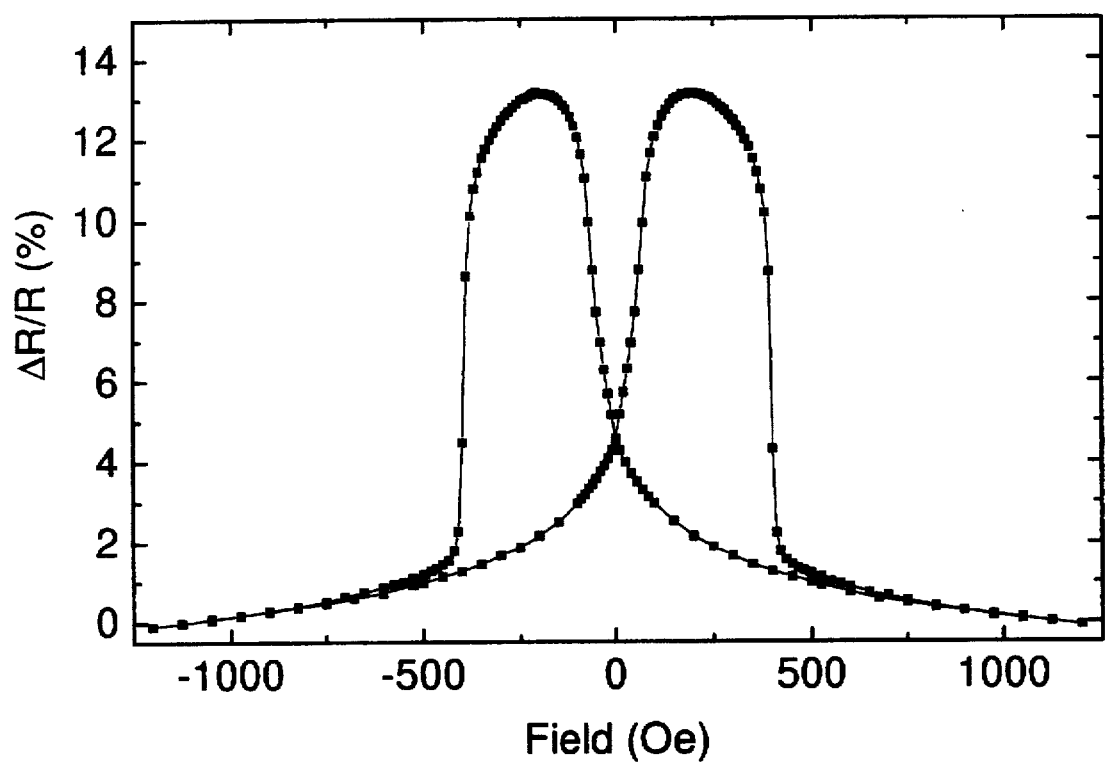
FIG. 4 is a typical magnetoresistance response curve of the prior art MTJ represented in FIG. 3.

FIG. 4 shows the change in the tunneling resistance (magnetoresistance MR) of this prior art MTJ element of FIG. 3 as a magnetic field applied parallel to the layers of the MTJ element along the magnetic easy axis of the element. The resistance is measured by passing a current perpendicular to the layers across the tunnel barrier layer 20. As shown in FIG. 4, the tunneling magnetoresistance curve exhibits considerable hysteresis in the range of the field of interest, i.e., approximately ±300 Oe for memory applications. Indeed, the magnetoresistance curve exhibits two "humps" at positive and negative fields of approximately 200 Oe. In FIG. 4, the magnetic field was first set to +1200 Oe, which is sufficient to align the magnetic moments of both the top and bottom ferromagnetic layers parallel to the field. As the field is reduced to just below zero, there is a large change in the resistance of the MTJ element, which is caused by the magnetic moment of the free ferromagnetic layer 32 in the top electrode largely changing its orientation with respect to that of the moment of the fixed ferromagnetic layer 18 in the bottom electrode. In large positive fields, the magnetic moments of the free and fixed ferromagnetic layers are parallel to one another, whereas in small negative fields the moments are approximately antiparallel to one another and the resistance of the MTJ element is approximately 13% higher than the resistance in large positive fields. At not much larger negative fields near approximately −400 Oe, corresponding approximately to the coercivity of the $Co_{50}Fe_{50}$ fixed ferromagnetic layer 18, the magnetic moment of this layer in the lower electrode rotates so that it becomes parallel to the applied field and thus parallel to the moment of the ferromagnetic layer 32 in the top electrode, thereby causing a reduction in the resistance of the MTJ element. This accounts for the hump in the tunneling magnetoresistance curve near approximately −250 Oe. On increasing the field from large negative fields to positive fields, a similar sequence of changes in magnetic orientation of the moments of layers 18 and 32 accounts for the hump at small positive fields near approximately +250 Oe. The form of the tunneling magnetoresistance curve in this prior art MTJ element is not suitable for either memory or field-sensing applications because the MTJ element does not exhibit two well-defined magnetic states in zero field. Similar structures are described in the literature and all display similar tunneling magnetoresistance curves to that shown in FIG. 4. For example, J. S. Moodera and L. R. Kinder in "Ferromagnetic-Insulator-Ferromagnetic Tunneling: Spin Dependent Tunneling and Large Magnetoresistance in Trilayer Junctions", *Journal of Applied Physics*, Vol. 79, 1996, page 4724, describe $CoFe/Al_2O_3/Co$ and $Fe_{70}Pt_{30}/Al_2O_3/NiFe$ structures with double-humped tunneling magnetoresistance versus field curves. J. S. Moodera et al. in "Geometrically Enhanced Magnetoresistance in Ferromagnet-Insulator-Ferromagnet Tunnel Junctions", *Applied Physics Letters*, Vol. 69, 1996, page 708, describe similar $CoFe/AlN/Ni_{80}Fe_{20}$ junctions in which they demonstrate that the response of the MTJ element is not stable to magnetic field cycling even for applied fields as small as ±20 Oe. Similarly, T. Miyazaki et al. in "Large Magnetoresistance Effect in 82Ni—Fe/Al—Al2O3/Co Magnetic Tunneling Junction", *Journal of Magnetism and Magnetic Materials*, Vol. 98, No. L7, 1991, show tunneling magnetoresistance curves for a $Ni_{82}Fe_{18}/Al_2O_3/Co$ MTJ element which is not stable to field excursions of ±60 Oe.

Figure 5:
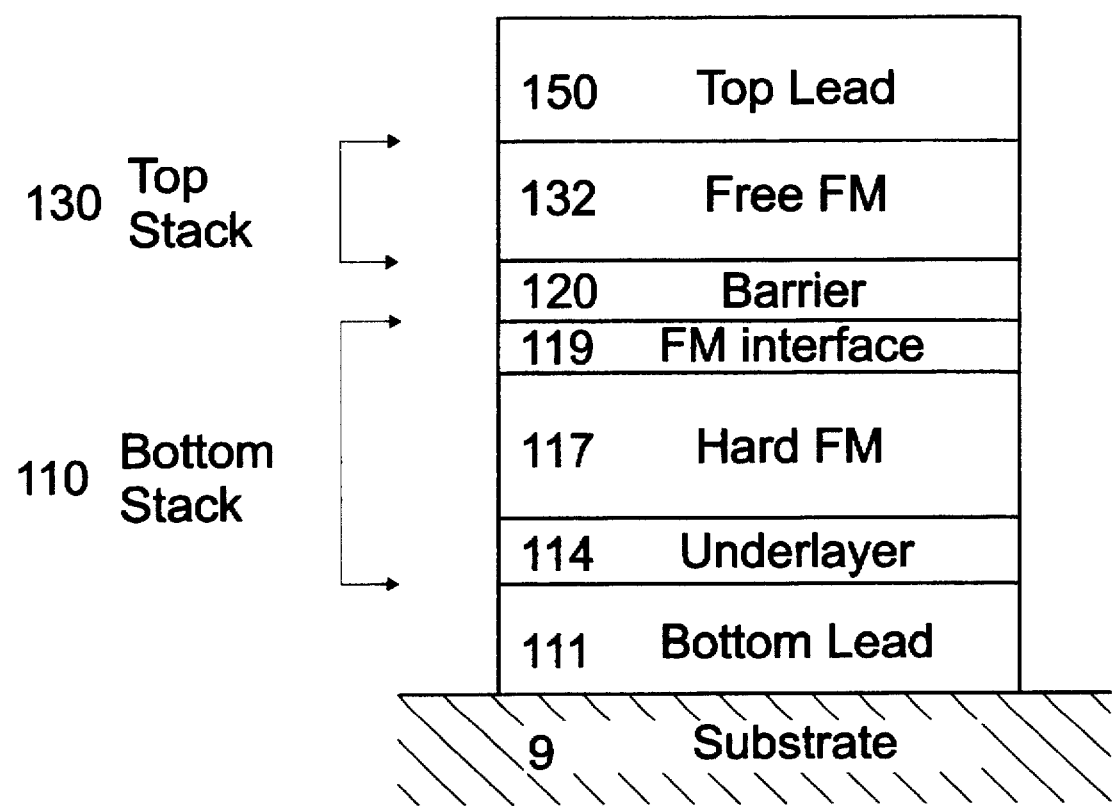
FIG. 5 is a schematic representation of the layers making up the MTJ according to the present invention with a fixed ferromagnetic multilayer, including a ferromagnetic interface layer with high spin-filtering efficiency.

What is needed in place of the prior art MTJ element according to the structure of FIG. 3 and with the undesirable tunneling magnetoresistance response of FIG. 4 is a MTJ element that has a ferromagnetic material for the hard fixed ferromagnetic layer that has not only high coercivity and high remanent magnetic moment, but which also provides a strong spin-filtering effect for electrons tunneling from this ferromagnetic layer across the tunnel barrier. FIG. 5 shows the structure of the MTJ element according to the present invention. The lower electrode 110 includes an underlayer layer 114 of Cr and a multilayer structure that serves as the fixed ferromagnetic layer. The multilayer is formed of two layers: a high-coercivity hard ferromagnetic layer 117 and a thin interface ferromagnetic layer 119. The top electrode 130 formed on the alumina tunnel barrier layer 120 is preferably a single layer of $Ni_{40}Fe_{60}$ or Co that serves as the free ferromagnetic layer 132. An electrical lead layer 150 of Al is formed on the Co free layer 132 without the use of a protective layer.

The interface ferromagnetic layer 119 is located at the interface between the hard ferromagnetic layer 117 and the tunnel barrier 120. The interface layer 119 is a material chosen to have a strong spin-filtering effect, for example, Co, a Co—Fe alloy, a Ni—Fe alloy, a Co—Ni alloy, or a Co—Ni—Fe ternary alloy. Ferromagnetic materials which give rise to strong spin filtering are those which display high spin polarization of the tunneling electrons, i.e., a strong preponderance of electrons of one spin type (up or down), in experiments in which the tunneling of electrons is examined in ferromagnetic/tunnel barrier/superconducting electrode junctions. The spin polarization of the tunneling electrons can be inferred from the voltage dependence of the junction conductance in various large magnetic fields as discussed, for example, in the review paper, "Spin-polarized Electron Tunneling", by R. Meservey and P. M. Tedrow, *Physics Reports*, Vol. 238, 1994, page 200–214. As a general rule, it is found for the ferromagnetic 3d transition metal and alloys that the spin polarization of the tunneling electrons is larger the larger the magnetization of the metal. Meservey and Tedrow report values of the spin polarization of Ni, Co, and Fe at 0.4K of 23, 35, and 40%, respectively. Much smaller spin polarizations are found, for example, in the rare-earth metals, which in any case, have Curie temperatures typically below room temperature and thus would not be magnetic in the operating range of temperatures for useful memory cell and field sensing devices.

The high spin-filtering interface ferromagnetic layer 119 is made sufficiently thin such that the high coercivity of the underlying hard magnetic material in layer 117 is not significantly degraded. This is important so that the magnetic moment of the multilayer of layers 117 and 119 remains fixed and does not rotate in the presence of applied fields in the range of interest. However, the interface layer 119 must also be thick enough that it exhibits a significant spin-filtering effect. A suitable thickness range has been determined to be 0.8–2.0 nm.

Figure 6A:
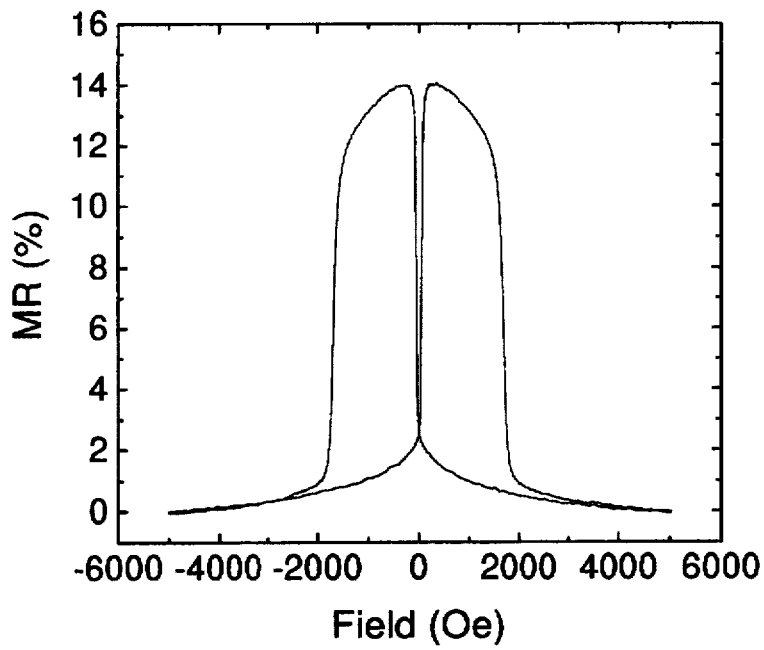
Figure 6B:
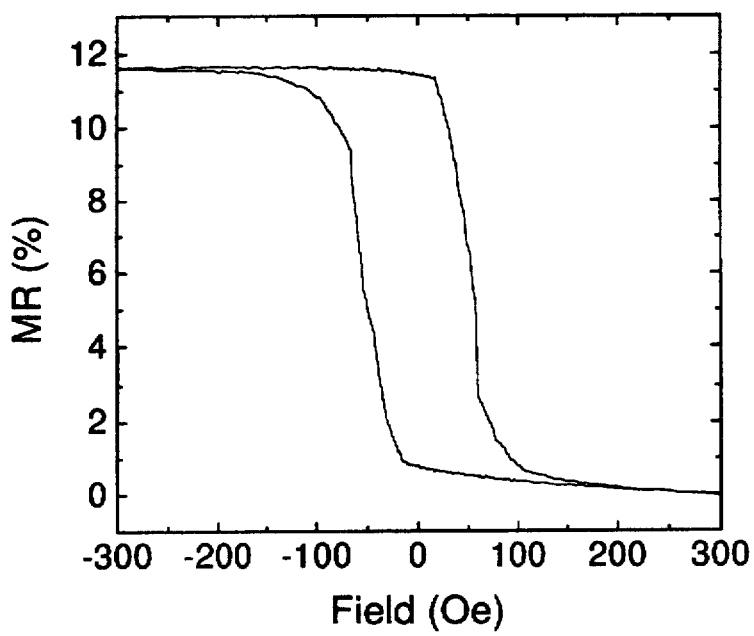

FIGS. 6A–6B are tunneling magnetoresistance curves for a MTJ element according to FIG. 5 with the following materials forming the layers identified in FIG. 5: 114 (15 nm Cr)/117 (10 nm $Co_{75}Pt_{12}Cr_{13}$)/119 (2 nm Co)/120 (1.2 nm Al plasma oxidized for 120 sec)/132 (15 nm Co)/150 (15 nm Al).

As can be seen from FIG. 6A, the multilayer structure of 10 nm $Co_{75}Pt_{12}Cr_{13}$/2 nm Co that forms the lower fixed ferromagnetic multilayer layer exhibits a relatively high coercivity exceeding 1900 Oe, which is well beyond the strength of fields of interest that would be applied by the read/write circuitry in a memory cell application. FIG. 6A also illustrates that the MTJ with the multilayer as the fixed ferromagnetic layer has two well-defined states near zero field, unlike the prior art MTJ, whose tunneling magnetoresistance curve is shown in FIG. 4.

Figure 7A:
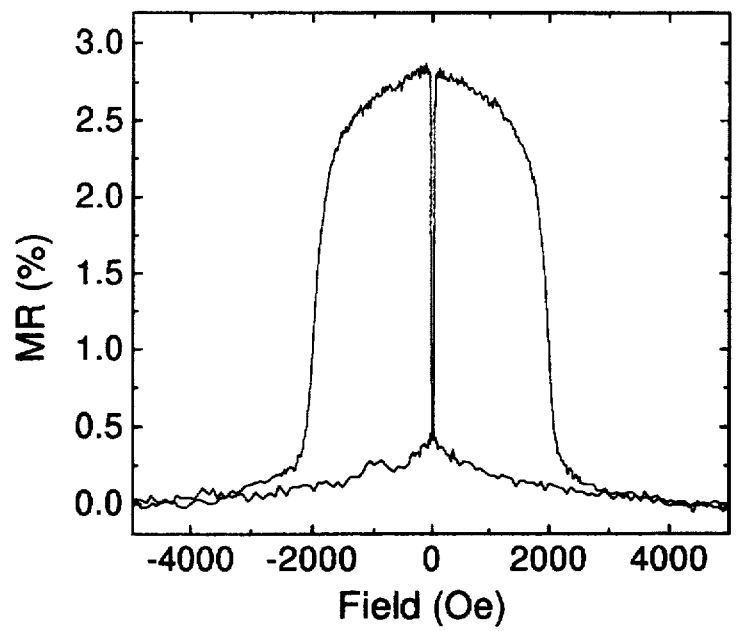
Figure 7B:
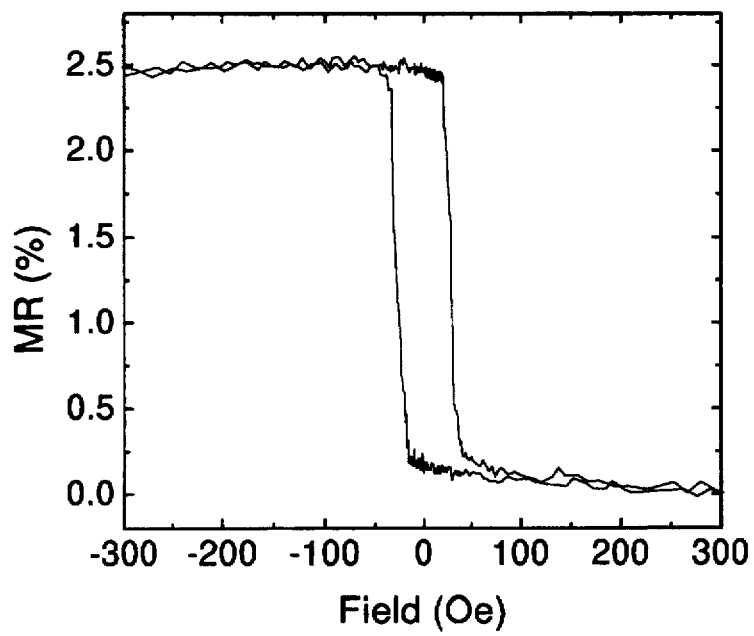
Figure 8A:
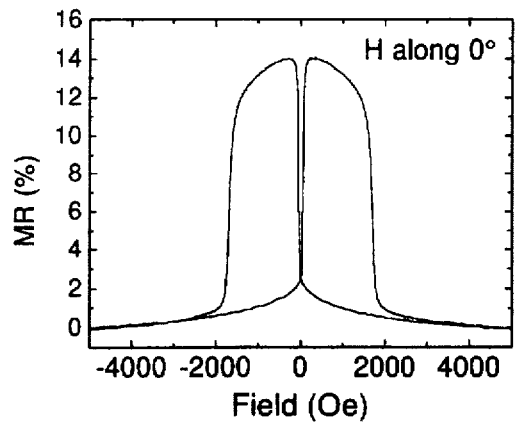
FIGS. 8A–8F are tunneling magnetoresistance response curves of the MTJ element of the present invention for sense fields applied along three different directions in the plane of the MTJ element, with the graph on the left side being the response curve for sense fields in the range ±5000 Oe and the corresponding graphs on the right side the response curves for sense fields limited in range to ±300 Oe, but in the same direction.
Figure 8B:
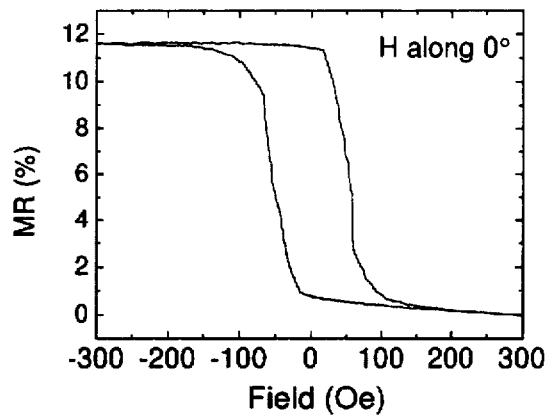
Figure 8C:
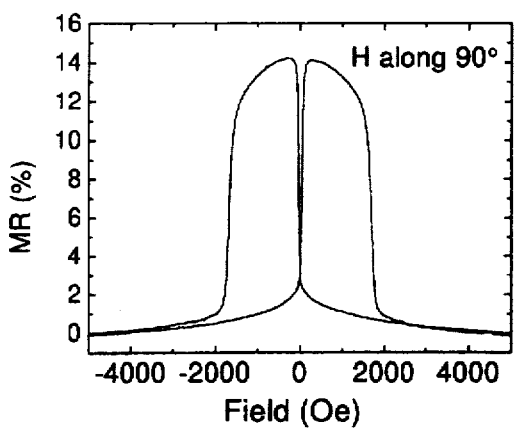
Figure 8D:
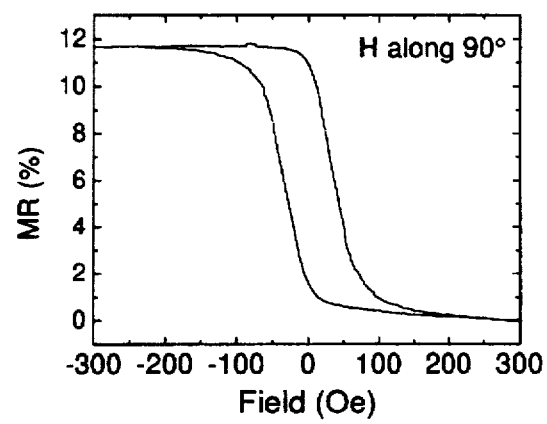
Figure 8E:
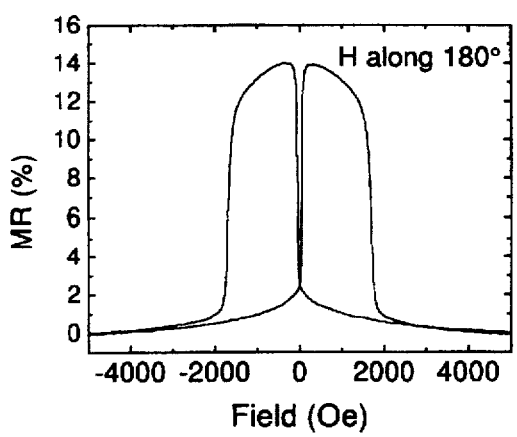
Figure 8F:
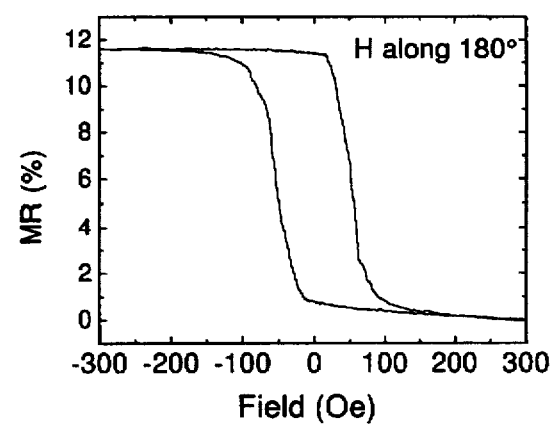

FIGS. 6A–6B will now be compared with FIGS. 7A–7B. FIG. 7A is a tunneling magnetoresistance versus field curve for a MTJ element with a structure of the form 20 nm Cr/10 nm $Co_{75}Pt_{12}Cr_{13}$/1.2 nm Al oxidized for 120 sec/15 nm Co/15 nm Al. Thus, unlike the MTJ of the present invention, the MTJ whose response is shown in FIGS. 7A–7B does not have a multilayer structure as the fixed ferromagnetic layer. Instead, the fixed ferromagnetic layer in the lower electrode is comprised of a single layer of $Co_{75}Pt_{12}Cr_{13}$. As can be seen from FIG. 7A, the $Co_{75}Pt_{12}Cr_{13}$ layer has a coercivity in excess of 2200 Oe, which is approximately 300 Oe higher than the coercivity of the multilayer structure in the present invention (FIG. 6A).

FIG. 7B shows the tunneling magnetoresistance versus field curve of the same MTJ element shown in FIG. 7A where the device has been subjected to fields limited to the range ±300 Oe. The tunneling magnetoresistance versus field curve shows two well-defined states in zero field. However, the tunneling magnetoresistance of the MTJ is very small, i.e., approximately 2.5%. A comparison of the magnitude of the tunneling magnetoresistance curve of FIG. 7B with that of FIG. 6B shows that the MTJ of the present invention with the multilayer structure as the fixed ferromagnetic layer has a nearly five times greater magnetoresistance response (from 2.5% to approximately 12%). Moreover, this is accomplished while maintaining an excellent magnetic response curve with two well-defined states near zero field. Thus, the improvement is deemed due to the Co interface layer, which has not substantially altered the required properties of the $Co_{75}Pt_{12}Cr_{13}$ layer.

The magnetic and magnetoresistive properties of the structure of FIG. 5 are affected by the magnetic fields in which the structure is grown, and also by the field in which the structure is "set". The Co free ferromagnetic layer in the top electrode has a small uniaxial magnetic anisotropy whose direction is determined by the magnetic field in which this layer is grown. This leads to an "easy" and a "hard" direction in the plane of the film in which the magnetic moment of the free layer can be more or less readily saturated. Here the directions of the easy and hard axes of the Co free layer within the plane of the film are defined as $\phi=0$ degree and 90 degrees, respectively. The operation of the MTJ element of the present invention is determined in large part by the direction in which a large magnetic field (here 5000 Oe) is applied in the plane of the sample to set the magnetic moment of the $Co_{75}Pt_{12}Cr_{13}$/Co multilayer in the bottom electrode. This is illustrated in FIGS. 8A–8F which show three sets of magnetoresistance versus field curves for the same MTJ element depicted in FIG. 5. Each set of FIGS. (8A–8B, 8C–8D, and 8E–8F) corresponds to a large setting field being applied first along the easy axis direction of the Co layer ($\phi=0$ degree), second along the hard axis direction of the Co layer ($\phi=90$ degrees), and third along the easy axis in the opposite direction ($\phi=180$ degrees). The applied field is first swept from +5000 Oe to −5000 Oe and back to +5000 Oe. The second figure in each set shows the response of the MTJ for applied (sense) fields limited to ±300 Oe in the same direction as the set field. The responses, for fields swept both between ±5,000 Oe and ±300 Oe, are very similar along all three in-plane directions, although the uniaxial anisotropy of the Co free layer slightly affects the low field response, giving a squarer response in low fields for fields applied along the easy axis (compare FIGS. 8B and 8F with FIG. 8D). These data show that the magnetic moment of the fixed ferromagnetic multilayer of $Co_{75}Pt_{12}Cr_{13}$/Co can be set in any direction in the plane of the sample with a similar remanent magnetic moment in each case. This is additionally shown by the identical values of magnetoresistance obtained for all directions in the plane of the sample.

Figure 10:
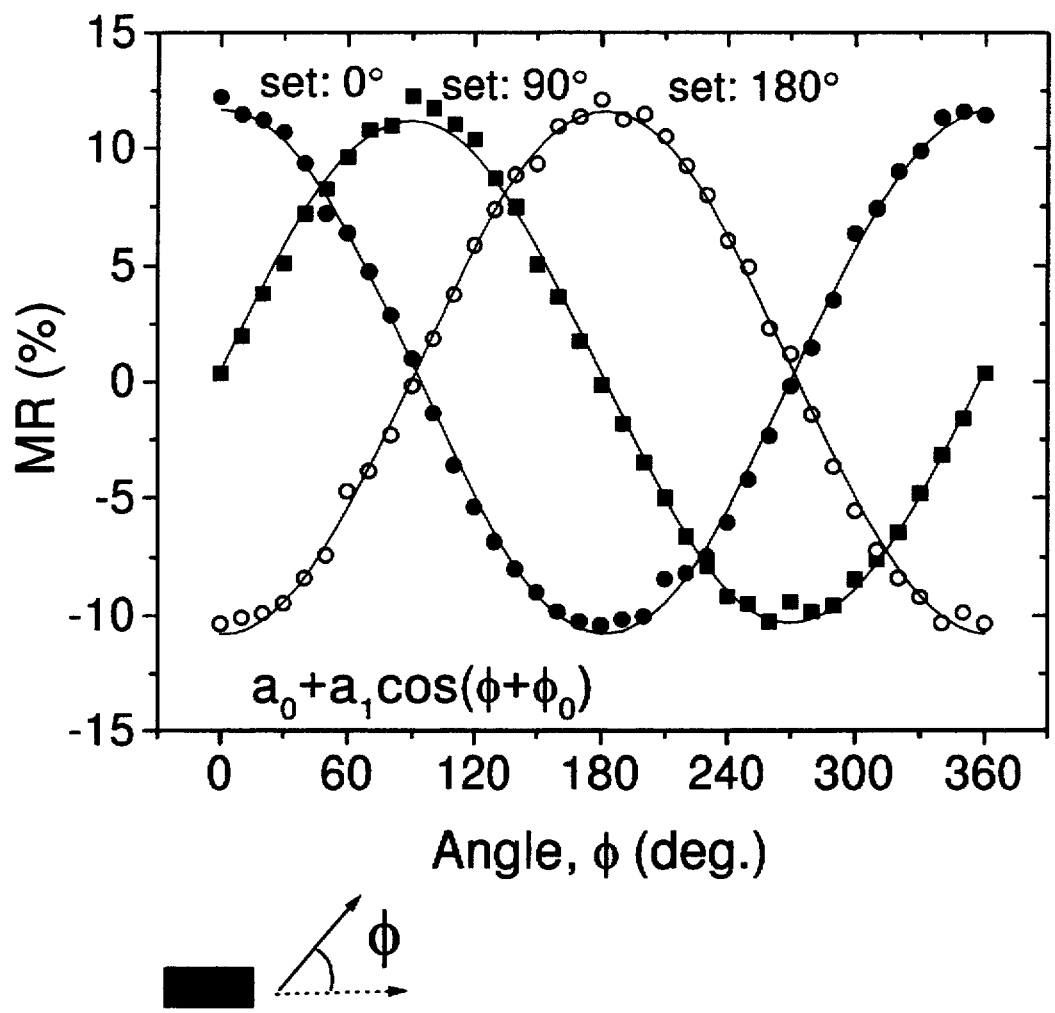
FIG. 10 is a graph of the magnetoresistive response of the MTJ element of the present invention as a function of the angle the direction of the sense field makes in the plane of the MTJ element with respect to the easy axis of the ferromagnetic free layer, wherein three representative curves are shown for three different settings of the ferromagnetic moment of the hard layer.

The possibility of setting the fixed layer in any direction in the plane of the sample is further illustrated in FIGS. 9A–9D and FIG. 10. FIGS. 9A–9D show the tunneling magnetoresistance data for the MTJ of FIG. 5 when the magnetic moment of the $Co_{75}Pt_{12}Cr_{13}$/Co multilayer is set along $\phi=90$ degrees, i.e., along the hard magnetic anisotropy axis of the Co free layer in the plane of the sample, by applying a large field of +5000 Oe. Subsequently, a series of MR versus H loops are taken for four orthogonal directions in the plane of the sample for which the sense field, H, is limited to ±300 Oe, a range of fields to which the MTJ device may be subjected in either memory or read head applications. Now, as previously defined, $\phi$ is the direction of the applied field H within the plane of the sample measured with respect to the easy axis of the Co free layer. When the field is applied in the same direction as the direction in which the magnetic moment of the $Co_{75}Pt_{12}Cr_{13}$/Co multilayer has been set (for these data, $\phi=90$ degrees), the resistance of the MTJ is highest in negative field (FIG. 9A). By contrast, when the field is applied along the opposite direction to the direction of the setting field ($\phi=270$ degrees), the MTJ resistance is highest for positive fields. When the applied field is oriented along a direction orthogonal to the direction of the setting field (here $\phi=180$ degrees or 0 degree), very little MR is observed. These data are thus consistent with the magnetic moment of the $Co_{75}Pt_{12}Cr_{13}$/Co multilayer being aligned along the direction of the setting field, $\phi=90$ degrees, and being essentially fixed along this direction when the sense field, limited in range to ±300 Oe, is applied in any direction in the plane of the sample. By contrast, the application of a sense field along any direction $\phi$, limited in range to ±300 Oe, is sufficient to rotate the magnetic moment of the free layer parallel or antiparallel to this direction. In a simple tunneling model, the MR of the MTJ element is proportional to the cosine of the angle between the fixed moment of the $Co_{75}Pt_{12}Cr_{13}$/Co multilayer and the moment of the free Co layer. Thus, when the moment of the free layer is aligned, by application of the sense field, either parallel or antiparallel to that of the moment of the fixed layer, large positive or negative MR is observed. In contrast, when the moment of the free layer is aligned, by application of the sense field, in a direction in the plane of the film approximately orthogonal to that of the fixed layer, very little MR is found, as is shown in FIGS. 9C and 9D. FIG. 10 shows a detailed measurement of the dependence of the MR on the direction of the sense field in the plane of the sample $\phi$, limited in range to ±300 Oe, for three different settings of the fixed magnetic moment direction ($\phi$=0, 90, and 180 degrees). FIG. 10 shows that the dependence of MR on $\phi$ is well described by a simple $\cos(\phi+\phi_o)$ dependence, where $\phi_o$ is the angle that the moment of the fixed multilayer is set to relative to the easy axis of the Co free layer. When the magnetic moment of the fixed layer is set along $\phi$=0, 90, and 180 degrees, the MR varies respectively as $\cos(\phi)$, $\cos(\phi$—90 degrees) and $\cos(\phi$—180 degrees), consistent with the data shown in FIG. 9.

In the present invention, the fixed ferromagnetic multilayer with the thin interface layer allows the possibility of using low magnetization (and thus poor spin filtering) ferromagnetic materials for the hard high-coercivity ferromagnetic layer. The hard ferromagnetic layer may thus be formed from a variety of ferromagnetic materials, such as alloys of Co and one or more other elements, including Co—Pt—Cr alloys, Co—Cr—Ta alloys, Co—Cr alloys, Co—Sm alloys, Co—Re alloys, Co—Ru alloys, and Co—Ni—X alloys (X=Pt, Pd, or Cr), as well as a variety of quaternary alloys, such as Co—Ni—Cr—Pt and Co—Pt—Cr—B. The use of low magnetization materials has an important advantage for MTJ elements because this reduces the magnetostatic interaction between the fixed ferromagnetic layer and the free ferromagnetic layer. In addition, for memory cell applications, the lower magnetic moment will reduce the magnetostatic interactions between neighboring MTJ elements in an array of memory cells.

The coercivity of the hard ferromagnetic layer 117 in the multilayer will be strongly influenced by the underlayer 114 on which it is formed. For Co—Pt—Cr alloys, the preferred underlayer material is a thin layer of Cr 10–50 nm thick. Other possible underlayers include Cr—V alloys, Ta, Ta—W alloys, Ti—W alloys, W and Mo.

The present invention provides the additional advantage that the fixed ferromagnetic multilayer with the thin spin-filtering interface layer results in a MTJ element which is robust against high temperatures. A MTJ element with its fixed ferromagnetic layer having its magnetic moment pinned by interfacial exchange coupling with an antiferromagnetic layer, as described in the previously-cited copending application, can only be operated over a limited range of temperature, defined by the blocking temperature of the antiferromagnetic material. In addition, the thermal stability of such a MTJ is limited by the thermal stability of the antiferromagnetic layer in contact with the neighboring layers, including the ferromagnetic layer pinned by the antiferromagnetic layer, and any seed layers required for the proper operation of the antiferromagnetic layer.

The MTJ device described and shown in the figures has the fixed multilayer located on the bottom near the substrate, but the device can also be formed by depositing the free ferromagnetic layer first, followed by the tunnel barrier layer, the spin-filtering interface layer, and the hard ferromagnetic layer. Such a MTJ device would then have the layers essentially inverted from the MTJ device shown in FIG. 5.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device for connection to electrical circuitry that detects a change in electrical resistance of the device in the presence of an applied magnetic field, the device comprising:
   a multilayer of two ferromagnetic layers, the multilayer comprising a first ferromagnetic layer having a coercivity substantially higher than applied magnetic fields in the range of interest of the device and an interface ferromagnetic layer formed on and in contact with the first ferromagnetic layer, the interface layer having a magnetization substantially higher than the magnetization of the first ferromagnetic layer and being sufficiently thin relative to the thickness of the first ferromagnetic layer so that the multilayer does not have a coercivity substantially less than the coercivity of the first ferromagnetic layer, whereby the multilayer has a magnetic moment that is fixed in a preferred direction in the presence of an applied magnetic field in the range of interest;
   a free ferromagnetic layer whose magnetic moment is free to rotate in the presence of an applied magnetic field in the range of interest;
   an insulating tunneling layer located between and in contact with the interface ferromagnetic layer in said multilayer and the free ferromagnetic layer for permitting tunneling current in a direction generally perpendicular to the multilayer and free ferromagnetic layers; and
   a substrate, wherein the multilayer, tunneling layer and free ferromagnetic layer are formed on the substrate.

2. The magnetic tunnel junction device according to claim 1 wherein the magnetic moments of the multilayer and the free ferromagnetic layer are substantially parallel or antiparallel to one another in the absence of an applied magnetic field.

3. The magnetic tunnel junction device according to claim 1 wherein the free ferromagnetic layer's magnetic moment is substantially perpendicular to the multilayer's magnetic moment in the absence of an applied magnetic field.

4. The magnetic tunnel junction device according to claim 1 wherein the multilayer is located between the substrate and the insulating tunneling layer.

5. The magnetic tunnel junction device according to claim 1 wherein the free ferromagnetic layer is located between the substrate and the insulating tunneling layer.

6. The magnetic tunnel junction device according to claim 1 wherein the material of the free ferromagnetic layer is selected from the group consisting of Co, alloys of Co, and alloys of Ni—Fe.

7. The magnetic tunnel junction device according to claim 1 wherein the material of the first ferromagnetic layer in the multilayer comprises an alloy of Co and one or more of Cr, Pt, Pd, Ni, Ta, Sm, Re, Ru, and B.

8. The magnetic tunnel junction device according to claim 1 wherein the material of the first ferromagnetic layer in the multilayer is an alloy comprising Co, Pt, and Cr, and further comprising an underlayer on which the Co—Pt—Cr alloy is formed, the underlayer being formed of a material selected from the group consisting of Cr, Cr—V alloys, Ta, Ti—W alloys, Ta—W alloys, W and Mo.

9. The magnetic tunnel junction device according to claim 1 wherein the material of the interface ferromagnetic layer is Co.

10. The magnetic tunnel junction device according to claim 9 wherein the Co interface ferromagnetic layer has a thickness in the range of approximately 0.8 to 2.0 nanometers.

11. A magnetic tunnel junction memory cell having two magnetic states and usable in a magnetic memory array of memory cells, the array being connected to read/write circuitry for altering and detecting the magnetic state of individual memory cells in the array, the memory cell comprising:

a fixed ferromagnetic multilayer whose magnetic moment is fixed in a preferred direction in the presence of an applied magnetic field caused by current from the read/write circuitry, the fixed multilayer comprising a first ferromagnetic layer having a coercivity substantially higher than said applied magnetic field and an interface ferromagnetic layer formed on and in contact with the first ferromagnetic layer, the interface layer having a magnetization substantially higher than the magnetization of the first ferromagnetic layer and being sufficiently thin relative to the thickness of the first ferromagnetic layer so that the multilayer does not have a coercivity substantially less than the coercivity of the first ferromagnetic layer, whereby the fixed multilayer's magnetic moment remains fixed in said preferred direction in the presence of said applied magnetic field;

a free ferromagnetic layer whose magnetic moment is free to rotate between directions generally parallel and antiparallel to the magnetic moment of the fixed multilayer when exposed to said applied magnetic field;

an insulating tunnel barrier layer located between and in contact with the interface ferromagnetic layer in said multilayer and the free ferromagnetic layer for permitting tunneling current in a direction generally perpendicular to the fixed multilayer and the free ferromagnetic layer; and a substrate, wherein the fixed multilayer, tunneling layer and free ferromagnetic layer are formed on the substrate; whereby when the fixed multilayer and the free ferromagnetic layer are connected to the read/write circuitry, the electrical resistance to current flow through the insulating tunnel barrier layer in a direction generally perpendicular to the fixed multilayer and the free ferromagnetic layer is determined by said parallel or antiparallel magnetic moment of said free ferromagnetic layer, the value of said electrical resistance thereby allowing the magnetic state of the memory cell to be determined.

12. The magnetic tunnel junction memory cell according to claim 11 wherein the multilayer is located between the substrate and the insulating tunnel barrier layer.

13. The magnetic tunnel junction memory cell according to claim 11 wherein the free ferromagnetic layer is located between the substrate and the insulating tunnel barrier layer.

14. The magnetic tunnel junction memory cell according to claim 11 wherein the material of the free ferromagnetic layer is selected from the group consisting of Co, alloys of Co, and alloys of Ni—Fe.

15. The magnetic tunnel junction memory cell according to claim 11 wherein the material of the first ferromagnetic layer in the multilayer comprises an alloy of Co and one or more of Cr, Pt, Pd, Ni, Ta, Sm, Re, Ru, and B.

16. The magnetic tunnel junction memory cell according to claim 11 wherein the material of the first ferromagnetic layer in the multilayer is an alloy comprising Co, Pt, and Cr, and further comprising an underlayer on which the Co—Pt—Cr alloy is formed, the underlayer being formed of a material selected from the group consisting of Cr, Cr—V alloys, Ta, Ti—W alloys, Ta—W alloys, W and Mo.

17. The magnetic tunnel junction memory cell according to claim 11 wherein the material of the interface ferromagnetic layer is Co.

18. The magnetic tunnel junction memory cell according to claim 17 wherein the Co interface ferromagnetic layer has a thickness in the range of approximately 0.8 to 2.0 nanometers.

19. A magnetic tunnel junction memory cell having two magnetic states and usable in a magnetic memory array of memory cells, the array being connected to read/write circuitry for altering and detecting the magnetic state of individual memory cells in the array, the memory cell comprising:

a substrate;

a fixed ferromagnetic multilayer whose magnetic moment is fixed in a preferred direction in the presence of an applied magnetic field caused by current from the read/write circuitry, the fixed multilayer comprising a ferromagnetic layer of an alloy comprising Co, Pt, and Cr formed on the substrate and having a coercivity substantially higher than said applied magnetic field and an interface ferromagnetic layer consisting essentially of Co formed on and in contact with the Co—Pt—Cr layer, the interface Co layer having a magnetization substantially higher than the magnetization of the Co—Pt—Cr layer and being sufficiently thin relative to the thickness of the Co—Pt—Cr layer so that the multilayer does not have a coercivity substantially less than the coercivity of the Co—Pt—Cr layer, whereby the fixed multilayer's magnetic moment remains fixed in said preferred direction in the presence of said applied magnetic field;

a free ferromagnetic layer whose magnetic moment is free to rotate between directions generally parallel and antiparallel to the magnetic moment of the fixed multilayer when exposed to said applied magnetic field;

an insulating tunnel barrier layer located between and in contact with the interface Co layer in said multilayer and the free ferromagnetic layer for permitting tunneling current in a direction generally perpendicular to the fixed multilayer and the free ferromagnetic layer; whereby when the fixed multilayer and the free ferromagnetic layer are connected to the read/write circuitry, the electrical resistance to current flow through the insulating tunnel barrier layer in a direction generally perpendicular to the fixed multilayer and the free ferromagnetic layer is determined by said parallel or antiparallel magnetic moment of said free ferromagnetic layer, the value of said electrical resistance thereby allowing the magnetic state of the memory cell to be determined.

20. The magnetic tunnel junction memory cell according to claim 19 wherein the material of the free ferromagnetic layer is selected from the group consisting of Co, alloys of Co, and alloys of Ni—Fe.

21. The magnetic tunnel junction memory cell according to claim 19 further comprising an underlayer on which the Co—Pt—Cr alloy is formed, the underlayer being formed of a material selected from the group consisting of Cr, Cr—V alloys, Ta, Ti—W alloys, Ta—W alloys, W and Mo.

22. The magnetic tunnel junction memory cell according to claim 19 wherein the Co interface ferromagnetic layer has a thickness in the range of approximately 0.8 to 2.0 nanometers.

23. A magnetic tunnel junction magnetic field sensor for detecting external magnetic fields, the sensor comprising:

a fixed ferromagnetic multilayer whose magnetic moment is fixed in a preferred direction in the presence of an applied magnetic field in the range of the external magnetic field to be sensed, the fixed multilayer comprising a first ferromagnetic layer having a coercivity substantially higher than said applied magnetic field and an interface ferromagnetic layer formed on and in contact with the first ferromagnetic layer, the interface layer having a magnetization substantially higher than the magnetization of the first ferromagnetic layer and being sufficiently thin relative to the thickness of the first ferromagnetic layer so that the multilayer does not have a coercivity substantially less than the coercivity of the first ferromagnetic layer, whereby the fixed multilayer's magnetic moment remains fixed in said preferred direction in the presence of said applied magnetic field;

a free ferromagnetic layer whose magnetic moment is oriented generally perpendicular to the moment of the fixed multilayer in the absence of an applied magnetic field and is free to rotate away from said perpendicular orientation in the presence of an applied magnetic field in the range of the external magnetic field to be sensed;

an insulating tunnel barrier layer located between and in contact with the interface layer and the free ferromagnetic layer for permitting tunneling current in a direction generally perpendicular to the fixed multilayer and the free ferromagnetic layer; and a substrate, wherein the fixed multilayer, tunneling barrier layer and free ferromagnetic layer are formed on the substrate; whereby when the fixed multilayer and the free ferromagnetic layer are exposed to the external magnetic field to be sensed, the moment of the free ferromagnetic layer will change its orientation relative to the moment of the fixed multilayer and the electrical resistance to current flow through the insulating tunnel barrier layer in a direction generally perpendicular to the fixed multilayer and the free ferromagnetic layer will be altered, thereby allowing the external magnetic field to be detected.

24. The magnetic tunnel junction magnetic field sensor according to claim 23 wherein the multilayer is located between the substrate and the insulating tunnel barrier layer.

25. The magnetic tunnel junction magnetic field sensor according to claim 23 wherein the free ferromagnetic layer is located between the substrate and the insulating tunnel barrier layer.

26. The magnetic tunnel junction magnetic field sensor according to claim 23 wherein the material of the free ferromagnetic layer is selected from the group consisting of Co, alloys of Co, and alloys of Ni—Fe.

27. The magnetic tunnel junction magnetic field sensor according to claim 23 wherein the material of the first ferromagnetic layer in the multilayer comprises an alloy of Co and one or more of Cr, Pt, Pd, Ni, Ta, Sm, Re, Ru, and B.

28. The magnetic tunnel junction magnetic field sensor according to claim 23 wherein the material of the first ferromagnetic layer in the multilayer is an alloy comprising Co, Pt, and Cr, and further comprising an underlayer on which the Co—Pt—Cr alloy is formed, the underlayer being formed of a material selected from the group consisting of Cr, Cr—V alloys, Ta, Ta—W alloys, W and Mo.

29. The magnetic tunnel junction magnetic field sensor according to claim 23 wherein the material of the interface ferromagnetic layer is Co.

30. The magnetic tunnel junction magnetic field sensor according to claim 29 wherein the Co interface ferromagnetic layer has a thickness in the range of approximately 0.8 to 2.0 nanometers.

* * * * *